(12) United States Patent
Truong et al.

(10) Patent No.: US 12,394,604 B2
(45) Date of Patent: Aug. 19, 2025

(54) PLASMA SOURCE WITH FLOATING ELECTRODES

(71) Applicant: Applied Materials, Inc., Santa Clara, CA (US)

(72) Inventors: Quoc Truong, San Ramon, CA (US); Dmitry A. Dzilno, Sunnyvale, CA (US); Robert B. Moore, Bigfork, MT (US)

(73) Assignee: Applied Materials, Inc., Santa Clara, CA (US)

( * ) Notice: Subject to any disclaimer, the term of this patent is extended or adjusted under 35 U.S.C. 154(b) by 1337 days.

(21) Appl. No.: 17/017,952

(22) Filed: Sep. 11, 2020

(65) Prior Publication Data

US 2022/0084796 A1 Mar. 17, 2022

(51) Int. Cl.
| | | |
|---|---|---|
| H01L 21/00 | (2006.01) | |
| C23C 16/00 | (2006.01) | |
| C23C 16/455 | (2006.01) | |
| H01J 37/32 | (2006.01) | |
| H01L 21/02 | (2006.01) | |
| H05H 1/36 | (2006.01) | |
| H05H 1/34 | (2006.01) | |

(52) U.S. Cl.
CPC .. *H01J 37/32541* (2013.01); *C23C 16/45536* (2013.01); *H01J 37/32091* (2013.01); *H01J 37/32532* (2013.01); *H01J 37/3255* (2013.01); *H01L 21/0228* (2013.01); *H05H 1/36* (2013.01); *H05H 1/3431* (2021.05)

(58) Field of Classification Search
None
See application file for complete search history.

(56) References Cited

U.S. PATENT DOCUMENTS

| | | |
|---|---|---|
| 5,186,718 A | 2/1993 | Tepman et al. |
| 5,210,466 A | 5/1993 | Collins et al. |
| 5,646,489 A | 7/1997 | Kakehi et al. |
| 5,685,941 A | 11/1997 | Forster et al. |
| 6,132,566 A | 10/2000 | Hofmann et al. |
| 6,149,784 A | 11/2000 | Su et al. |
| 6,159,055 A * | 12/2000 | Satitpunwaycha .... H01R 13/33 439/700 |
| 6,176,981 B1 | 1/2001 | Hong et al. |
| 6,190,513 B1 | 2/2001 | Forster et al. |
| 6,203,620 B1 | 3/2001 | Moslehi |
| 6,228,229 B1 | 5/2001 | Raaijmakers et al. |
| 6,264,812 B1 | 7/2001 | Raaijmakers et al. |
| 6,297,595 B1 | 10/2001 | Stimson et al. |
| 6,461,483 B1 | 10/2002 | Gopalraja et al. |
| 6,486,431 B1 | 11/2002 | Smith et al. |
| 6,565,717 B1 | 5/2003 | Leet et al. |
| 6,632,324 B2 | 10/2003 | Chan |
| 6,707,255 B2 | 3/2004 | Coumou et al. |
| 6,815,633 B1 | 11/2004 | Chen et al. |
| 6,998,014 B2 * | 2/2006 | Chen ................. H01J 37/3244 156/345.43 |
| 7,102,292 B2 | 9/2006 | Parsons et al. |

(Continued)

*Primary Examiner* — Parviz Hassanzadeh
*Assistant Examiner* — Michelle Crowell
(74) *Attorney, Agent, or Firm* — Servilla Whitney LLC

(57) ABSTRACT

A plasma source assembly for use with a substrate processing chamber is described. The assembly includes a spring which is disposed between electrodes and a dielectric ring.

18 Claims, 5 Drawing Sheets

(56) References Cited

U.S. PATENT DOCUMENTS

| | | | |
|---|---|---|---|
| 7,244,474 B2* | 7/2007 | Hanawa | C23C 16/452 |
| | | | 427/574 |
| 7,396,431 B2 | 7/2008 | Chen et al. | |
| 7,780,790 B2* | 8/2010 | Nogami | C23C 16/45565 |
| | | | 156/345.43 |
| 8,040,068 B2 | 10/2011 | Coumou et al. | |
| 8,884,523 B2 | 11/2014 | Winterhalter et al. | |
| 9,004,006 B2* | 4/2015 | Kao | C23C 16/45565 |
| | | | 118/715 |
| 9,711,330 B2 | 7/2017 | Bera | |
| 11,776,793 B2* | 10/2023 | Moore | H01J 37/3244 |
| | | | 315/111.21 |
| 2002/0048963 A1 | 4/2002 | Campbell | H01J 37/32082 |
| | | | 438/758 |
| 2002/0127853 A1* | 9/2002 | Hubacek | H01J 37/3255 |
| | | | 156/345.43 |
| 2003/0137250 A1 | 7/2003 | Mitrovic | |
| 2003/0216037 A1 | 11/2003 | Zhang et al. | |
| 2004/0159287 A1 | 8/2004 | Hoffman et al. | |
| 2004/0161943 A1* | 8/2004 | Ren | H01J 37/3255 |
| | | | 438/758 |
| 2004/0194890 A1 | 10/2004 | Moroz | |
| 2005/0167263 A1 | 8/2005 | Chistyakov | |
| 2005/0217576 A1* | 10/2005 | Ishibashi | C23C 16/45574 |
| | | | 118/715 |
| 2006/0065367 A1 | 3/2006 | Chen et al. | |
| 2007/0181868 A1* | 8/2007 | Fujiwara | H01J 37/32009 |
| | | | 257/13 |
| 2007/0212896 A1 | 9/2007 | Olsen et al. | |
| 2008/0044960 A1 | 2/2008 | Al-Bayati et al. | |
| 2008/0099426 A1 | 5/2008 | Kumar et al. | |
| 2009/0139453 A1* | 6/2009 | Chen | H01J 37/3244 |
| | | | 118/723 I |
| 2010/0037822 A1* | 2/2010 | Ishibashi | H01L 21/02274 |
| | | | 118/723 E |
| 2010/0258247 A1* | 10/2010 | Hori | H05H 1/46 |
| | | | 156/345.35 |
| 2011/0100552 A1* | 5/2011 | Dhindsa | H01J 37/32174 |
| | | | 156/345.1 |
| 2011/0180213 A1 | 7/2011 | Hirayama et al. | |
| 2012/0073757 A1 | 3/2012 | Yamazawa | |
| 2014/0165911 A1* | 6/2014 | Kao | H01J 37/32532 |
| | | | 313/231.41 |
| 2015/0011096 A1* | 1/2015 | Chandrasekharan | |
| | | | C23C 16/45565 |
| | | | 239/289 |
| 2018/0330927 A1* | 11/2018 | Bera | H01L 21/68764 |
| 2019/0172682 A1* | 6/2019 | Ikari | H01L 21/67069 |

* cited by examiner

PLASMA SOURCE WITH FLOATING ELECTRODES

BACKGROUND

Embodiments of the disclosure generally relate to apparatus and methods for processing substrates. More particularly, embodiments of the disclosure relate to plasma sources for use with substrate processing chambers.

Semiconductor device formation is commonly conducted in substrate processing systems or platforms containing multiple substrate processing chambers, and these systems or platforms may also be referred to as cluster tools. In some instances, the purpose of a multi-chamber processing platform or cluster tool is to perform two or more processes on a substrate sequentially in a controlled environment. In other instances, however, a multiple chamber processing platform may only perform a single processing step on substrates. The additional chambers can be employed to maximize the rate at which substrates are processed. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

In some processing chambers, capacitively coupled plasma is used to deposit thin films on substrates or to treat films that have been deposited on substrates by ALD or CVD. Such chambers may be referred to as plasma enhanced ALD (PEALD) chambers and plasma enhanced CVD (PECVD) chambers. ALD processes are sensitive to contaminants in the chamber, and there is a desire to provide substrate processing chambers that minimize introduction of contaminants into the chamber during operation of the chamber.

SUMMARY

One or more embodiments of the disclosure are directed to plasma source assemblies comprising a first electrode comprising a conductive plate having an outer peripheral edge; a second electrode comprising a conductive plate having an outer peripheral edge; a dielectric spacer separating the first electrode and the second electrode and disposed at the outer peripheral edge of the first electrode and the outer peripheral edge of the second electrode; a power feed electrically connected to the first electrode; a first spring disposed between the bottom surface of the first electrode and the dielectric spacer; and a second spring disposed between the top surface of the second electrode and the dielectric spacer.

Additional embodiments of the disclosure are directed to plasma source assemblies comprising a first electrode comprising a conductive plate having an outer peripheral edge and a plurality of apertures allowing a gas to flow therethrough; a second electrode comprising a conductive plate having an outer peripheral edge a plurality of apertures allowing a gas to flow therethrough; a dielectric spacer separating the first electrode and the second electrode and disposed at the outer peripheral edge of the first electrode and the outer peripheral edge of the second electrode; a power feed electrically connected to the first electrode; a first conductive helical spring disposed between the bottom surface of the first electrode and the dielectric spacer, the first conductive helical spring comprising a metal alloy and coaxial with the outer peripheral edge of the first electrode; and a second conductive helical spring disposed between the top surface of the second electrode and the dielectric spacer, the second conductive helical spring comprising a metal alloy and coaxial with the outer peripheral edge of the second electrode.

Further embodiments of the disclosure are directed to a method of processing a substrate in a substrate processing chamber, the method comprising placing a substrate in the substrate processing chamber comprising a first electrode comprising a conductive plate having an outer peripheral edge and a plurality of apertures allowing a gas to flow therethrough; a second electrode comprising a conductive plate having an outer peripheral edge a plurality of apertures allowing a gas to flow therethrough; a dielectric spacer separating the first electrode and the second electrode and disposed at the outer peripheral edge of the first electrode and the outer peripheral edge of the second electrode; a power feed electrically connected to the first electrode; and a first conductive helical spring disposed between the bottom surface of the first electrode and the dielectric spacer, the first conductive helical spring comprising a metal alloy and coaxial with the outer peripheral edge of the first electrode; and a second conductive helical spring disposed between the top surface of the second electrode and the dielectric spacer, the second conductive helical spring comprising a metal alloy and coaxial with the outer peripheral edge of the second electrode. The method further comprises striking a plasma between the first electrode and the second electrode.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure provide plasma source assembly and a substrate processing chamber including a plasma source assembly in accordance with one or more embodiments of the disclosure. Further embodiments of the disclosure provide methods of processing as substrate in a substrate processing chamber.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

Figure 1:
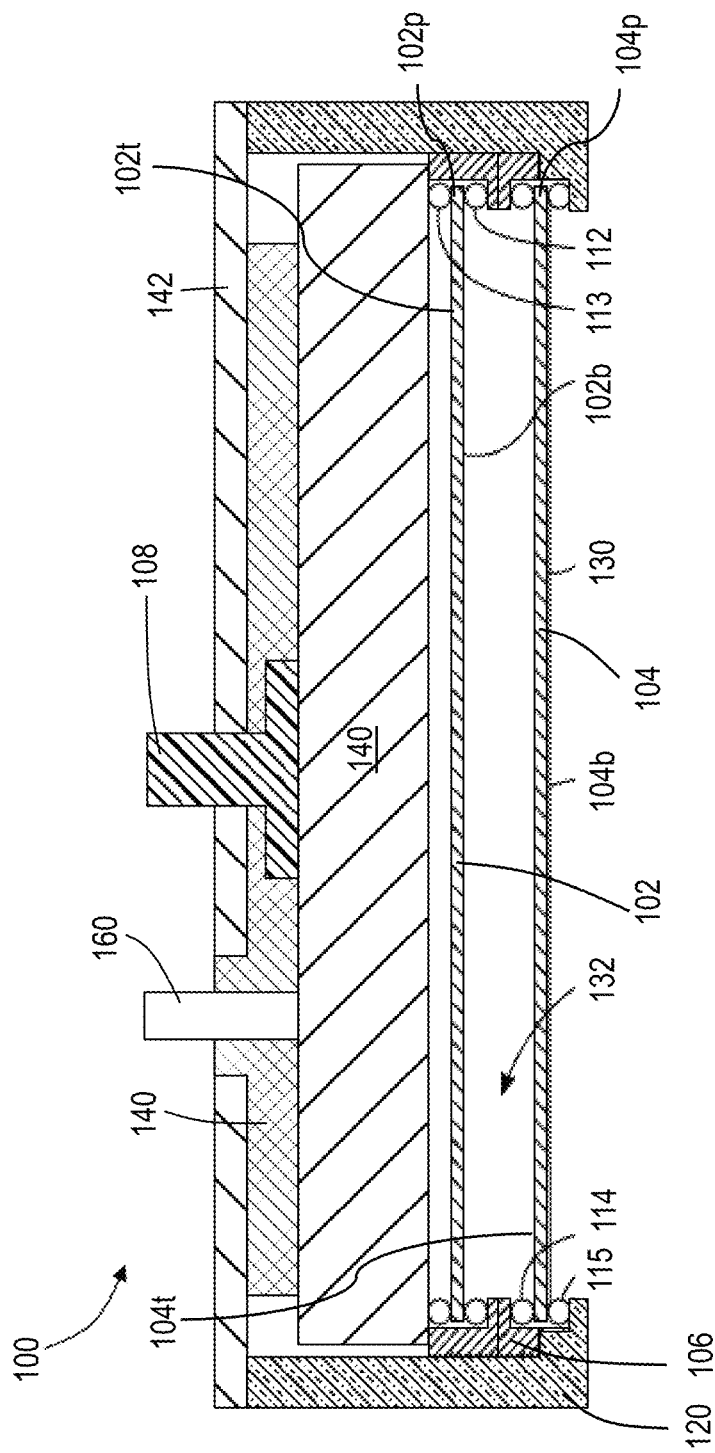
FIG. 1 shows a cross-sectional view of a plasma source assembly in accordance with one or more embodiments of the disclosure.

Referring now to FIG. 1, a plasma source assembly 100 according to one or more embodiments is shown. In the embodiment shown the plasma source assembly 100 comprises a first electrode 102 comprising a conductive plate having a top surface 102t, a bottom surface 102b and an outer peripheral edge 102p. The plasma source assembly 100 further comprises a second electrode 104 comprising a conductive plate having a top surface 104t, a bottom surface 104b and an outer peripheral edge 104p.

Figure 2:
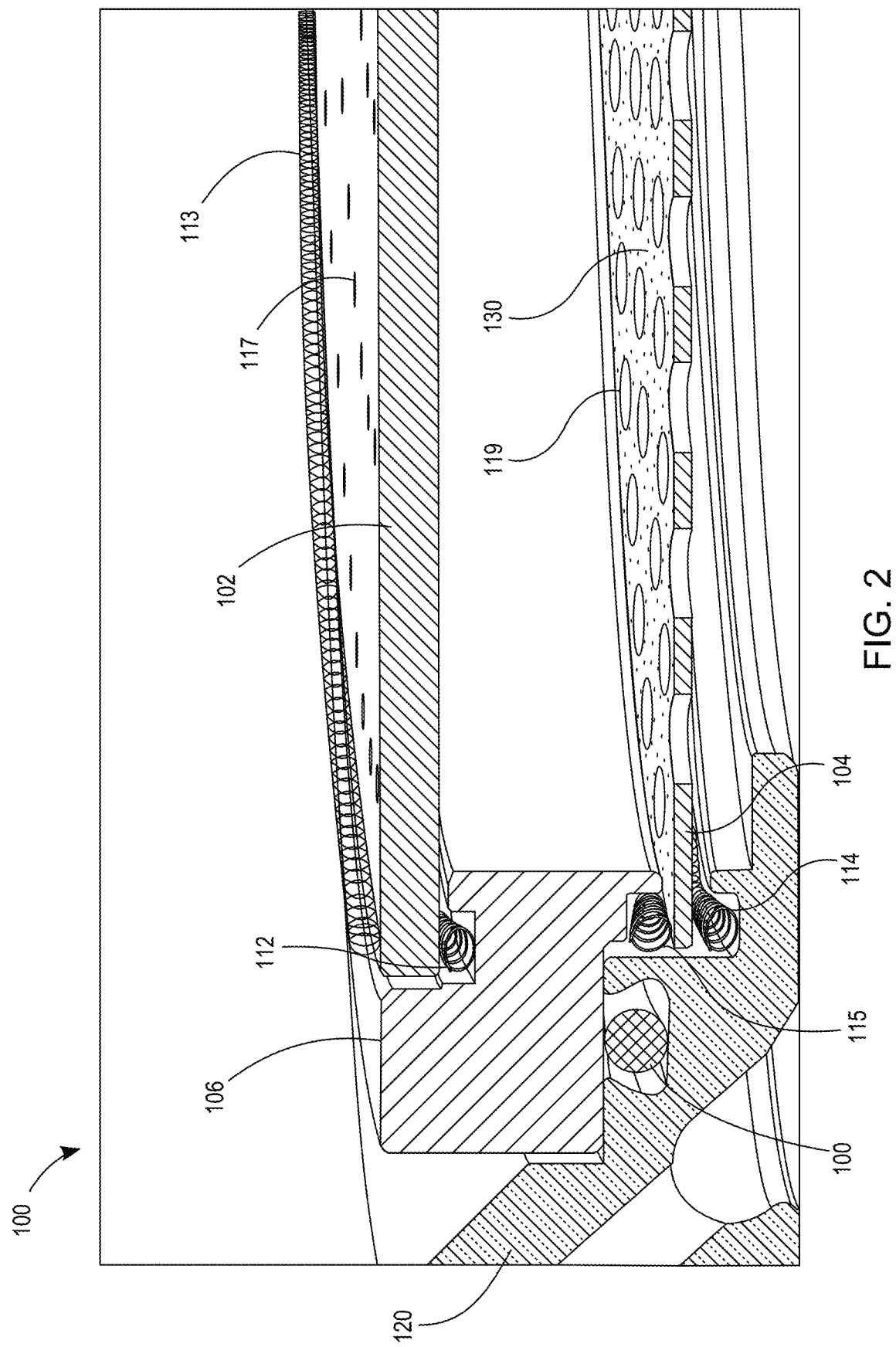
FIG. 2 shows an isometric view of a portion of a plasma source assembly in accordance with one or more embodiments of the disclosure
Figure 3:
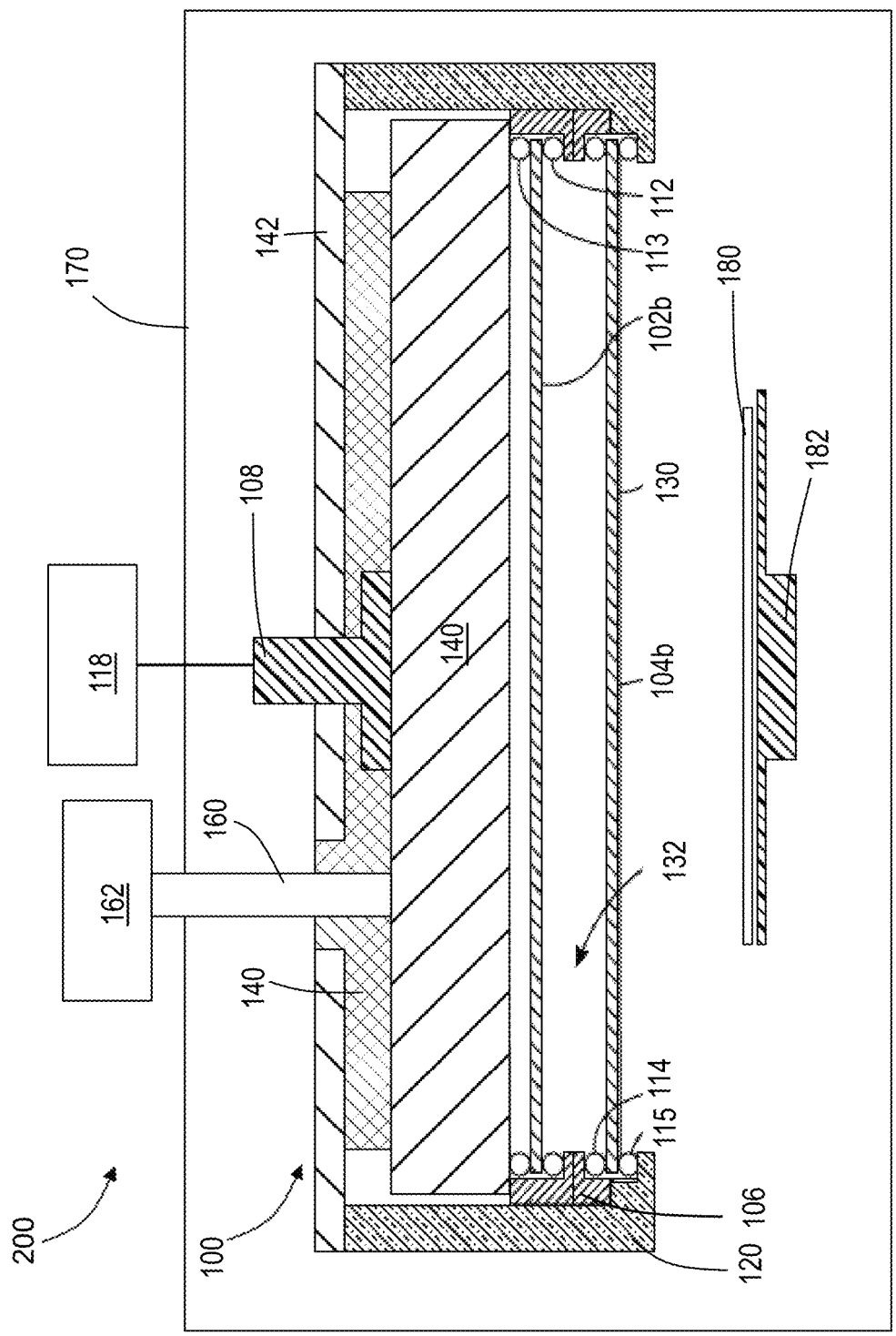
FIG. 3 shows a cross-sectional view of a substrate processing chamber including a plasma source assembly in accordance with one or more embodiments of the disclosure.

The plasma source assembly 100 further comprises a dielectric spacer 106 separating the first electrode 102 and the second electrode 104 and disposed at the outer peripheral edge 102p of the first electrode 102 and the outer peripheral edge 104p of the second electrode 104. There is a power feed 108 electrically connected to the first electrode 102 and the second electrode. The plasma source assembly further comprises a first spring 112 disposed between the bottom surface 102b of the first electrode and the dielectric spacer 106. There is also a second spring 114 disposed between the top surface 104t of the second electrode 104 and the dielectric spacer 106. According to one or more embodiments, the shape of the first electrode 102 and the second electrode 104 is generally round, and the first electrode 102 and the second electrode 104 each have a disc shape. The dielectric spacer 106 in some embodiments is ring shaped and surrounds the first electrode 102 and the second electrode 104. In FIG. 1 the dielectric spacer 106 is shown as constructed of two separate pieces abutting each other, however, as shown in FIG. 2, the dielectric spacer 106 can be a single piece as shown in FIG. 3. In some embodiments, there is a third spring 113 disposed on the top surface 102t of the first electrode 102 and adjacent to the outer peripheral edge 102p. In some embodiments, there is a fourth spring 115 in contact with the bottom surface 104b of the second electrode 104 and adjacent to the peripheral edge.

According to one or more embodiments, it was determined that o-rings made from certain materials, for example, fluorine-containing materials such as PTFE, placed where the first spring 112 and second spring 114 are located in FIG. 1 results in the production of fluorine in a substrate processing chamber at temperatures in excess of 300° C. Fluorine in the processing chamber interferes with certain chemical reactions during CVD and ALD processes, and in some instances, fluorine can terminate an ALD process reaction. One solution involved removing the o-rings from the plasma source assembly, however, it was determined that when the dielectric spacer 106 has a different coefficient of thermal expansion than the first electrode 102 and the second electrode 104, this could cause thermal stress to the dielectric spacer. In some instances, the thermal stress caused cracking of the dielectric spacer 106, requiring replacement of the plasma source assembly. In turn, the cracking of the dielectric spacer 106 results in equipment downtime. It was determined that utilizing a spring made from a conductive material, and in particular a metal or metal alloy avoided the problems associated with the use of o-rings while also preventing cracking of the dielectric spacer 106.

According to one or more embodiments, the first spring 112 is located adjacent to the outer peripheral edge 102p of the first electrode 102, and the second spring 114 is located adjacent to the outer peripheral edge 104p of the second electrode 104.

According to one or more embodiments, each of the first spring 112 and the second spring 114 comprises a metal. According to one or more embodiments, the metal is an alloy. In some embodiments, the alloy comprises cobalt, chromium, nickel and molybdenum. In some embodiments, the third spring 113 and the fourth spring 115 comprise a conductive material, such as metal, a metal alloy, and specifically a metal alloy comprising cobalt, chromium, nickel and molybdenum. In some embodiments, the metal alloy comprising cobalt, chromium, nickel and molybdenum is a superalloy. In one or more embodiments, a superalloy is non-magnetic and exhibits high strength while maintaining excellent formability, excellent corrosion resistance, and high fatigue strength. The metal alloy according to one or more embodiments performs up to temperatures of 450° C. without degradation or releasing harmful elements in a substrate processing chamber operating at temperatures up to 450° C. In some embodiments, the metal alloy exhibits a thermal expansion of 15.2 μm/m-° C. over a temperature range of 20° C. to 300° C. In some embodiments, the alloy exhibits an electrical resistivity of 99.6 μΩ·cm and a thermal conductivity of 12.5 W/m-K.

The plasma source assembly 100 shown in FIG. 1 further comprises a purge ring 120 comprising a conductive material surrounding and in contact with the dielectric spacer 106, and a power feed 108 in electrical communication with the purge ring 120. The alloy that is used to form the spring has an electrical resistivity that permits electrical communication between purge ring, the first electrode and the purge ring and the second electrode.

In one or more embodiments, the purge ring 120 comprises a metal such as aluminum or stainless steel, and the dielectric spacer 106 comprises a ring made from a ceramic such as alumina or quartz.

In the embodiment of the plasma source assembly 100 shown, the first electrode 102 and the second electrode 104 are spaced apart to provide a gap 132 between the first electrode 102 and the second electrode 104. In one or more embodiments, the first electrode 102 and the second electrode 104 comprise a material that allows a plasma to be formed between the first electrode 102 and the second electrode 104. In some embodiments, the first electrode 102 and the second electrode are made from or comprise silicon. The first electrode 102 may comprise a doped silicon. The second electrode 104 may comprise a cladding 103. In the embodiment shown, the cladding 130 is shown on the bottom surface 104b of the second electrode 104, but in other embodiments, the cladding 130 may be on the top surface 104t of the second electrode. In some embodiments, the cladding is silicon carbide.

As shown in FIG. 2, thein the first electrode comprises a plurality of apertures 117 that allow a gas to pass through the first electrode 102 and into the gap 132. In some embodiments, the second electrode 104 comprises a plurality of apertures 119 that allow a gas to pass through towards a substrate 150 on a pedestal 152 in a substrate processing chamber 200.

In some embodiments, first spring 112 comprises a helical spring that is in contact with the bottom surface 102b of the first electrode adjacent to the outer peripheral edge 102p of the first electrode 102, and the second spring 114 comprises a helical spring that is in contact with the top surface 104t of the second electrode 104 adjacent to the outer peripheral edge 104p of the second electrode 104.

Figure 4:
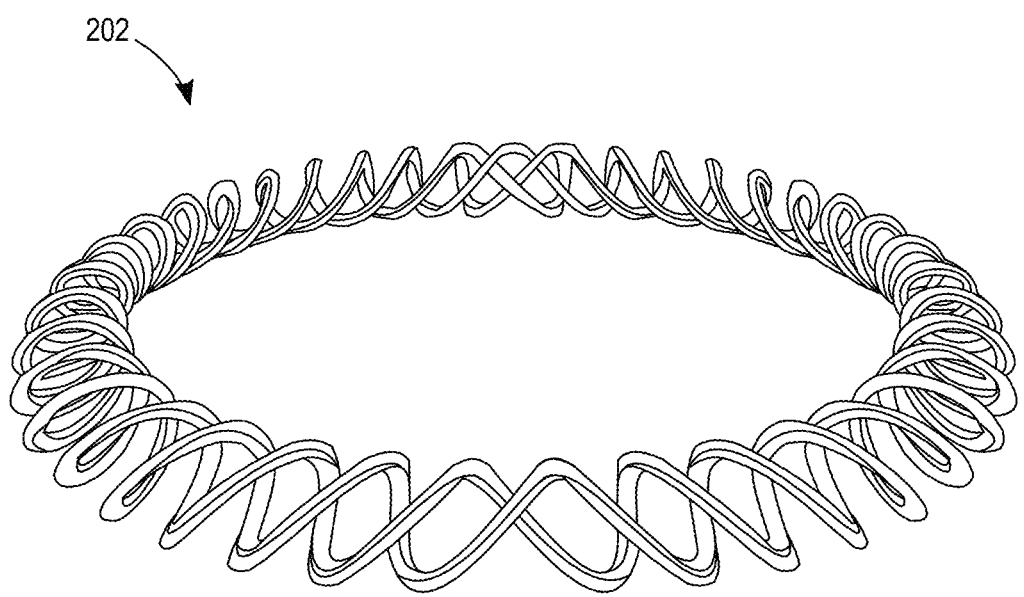
FIG. 4 is a perspective view of a helical spring according to one or more embodiments of the disclosure.

FIG. 4 shows a helical spring 202 in accordance with one or more embodiments. The helical spring 202 shown in FIG. 4 can comprise a conductive material, such a metal or a metal alloy as described above and have the composition and properties as described above according to one or more embodiments. In the embodiment shown, the helical spring is configured in the shape of a ring such that the helical spring 202 can be placed in contact with a disc-shaped electrode an in contact with a top surface or a bottom surface of the electrode and adjacent to and coaxial with the outer peripheral edge.

In a specific embodiment of the disclosure, a plasma source assembly comprises a first electrode 102 comprising a conductive plate having a top surface 102t, a bottom surface 102b and an outer peripheral edge 102p and a plurality of apertures 117 allowing a gas to flow therethrough. There is a second electrode 104 comprising a conductive plate having a top surface 104t, a bottom surface 104b and an outer peripheral edge 104p and a plurality of apertures 119 allowing a gas to flow therethrough. There is in the embodiments shown a dielectric spacer 106 separating the first electrode 102 and the second electrode 104 and disposed at the outer peripheral edge of the first electrode and the outer peripheral edge of the second electrode. There is a power feed 108 electrically connected to the first electrode 102; and first spring 112 in the form of a conductive helical spring disposed between the bottom surface 102b of the first electrode 102 and the dielectric spacer 106, the first spring 112 comprising a metal alloy and coaxial with the outer peripheral edge 102p of the first electrode. There is a second spring 114 in the form of a conductive helical spring disposed between the top surface 114t of the second electrode 104 and the dielectric spacer 106, the second spring 114 comprising a metal alloy and coaxial with the outer peripheral edge 104p of the second electrode 104.

As shown in FIG. 3, the plasma source assembly 100 can be incorporated into a substrate processing chamber 200, for example, PEALD or PECVD chamber. The plasma source may include an isolator 140 comprising an insulator material such as a ceramic and a lid 142 comprising a metal. The plasma source assembly further comprises a gas inlet 160 in the form a conduit. The gas inlet 160 is connected to a gas supply to supply a processing gas, for example argon or another suitable gas for forming a plasma. The power feed 108 is connected to a suitable power supply such as a radio frequency (RF) or microwave power supply. The substrate processing chamber 200 may be in an enclosure 170. A substrate 180 may be placed upon a substrate support 172, which may be a susceptor or other suitable substrate support.

Figure 5:
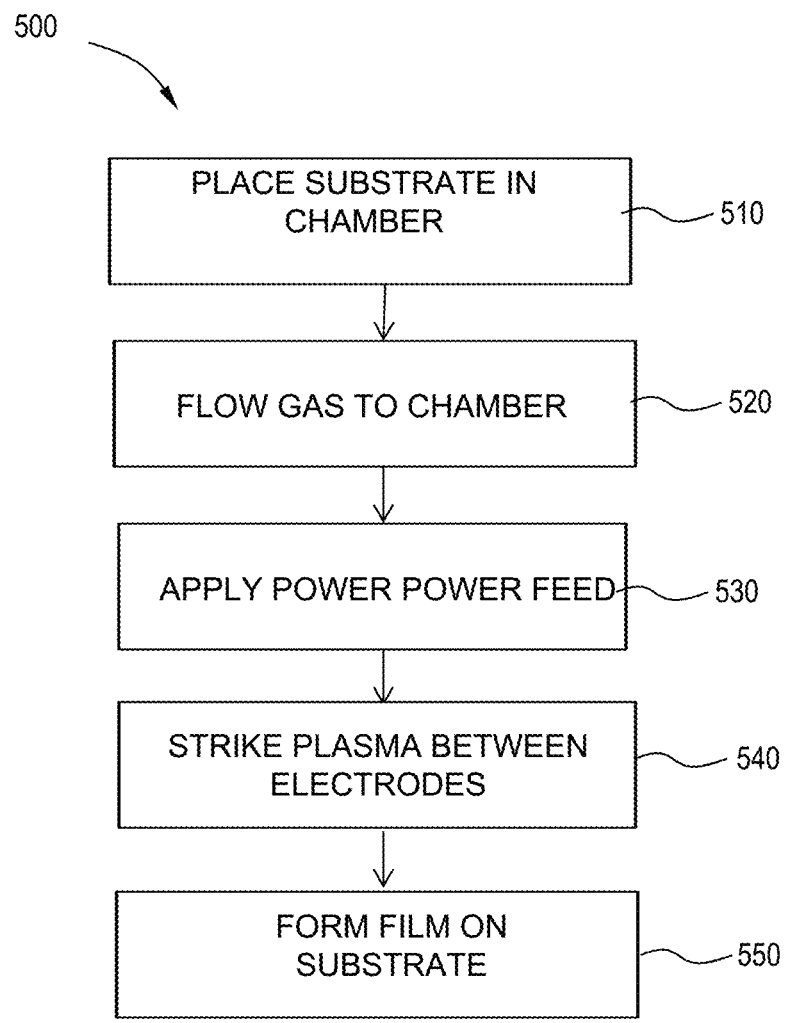
FIG. 5 shows a flow chart of a method in accordance with one or more embodiments of the disclosure.

Referring now to FIG. 5, another aspect pertains to a method 500 of processing a substrate in a substrate processing chamber. The method comprises at 510 placing a substrate in the substrate processing chamber. The substrate processing chamber can be similar to the chamber shown and described herein and comprise a first electrode comprising a conductive plate having a top surface, a bottom surface, an outer peripheral edge and a plurality of apertures allowing a gas to flow therethrough; a second electrode comprising a conductive plate having a top surface, a bottom surface, an outer peripheral edge a plurality of apertures allowing a gas to flow therethrough; a dielectric spacer separating the first electrode and the second electrode and disposed at the outer peripheral edge of the first electrode and the outer peripheral edge of the second electrode; a power feed electrically connected to the first electrode; a first conductive helical spring disposed between the bottom surface of the first electrode and the dielectric spacer, the first conductive helical spring comprising a metal alloy and coaxial with the outer peripheral edge of the first electrode; and a second conductive helical spring disposed between the top surface of the second electrode and the dielectric spacer, the second conductive helical spring comprising a metal alloy and coaxial with the outer peripheral edge of the second electrode. The method 500 may further comprise at 510 flowing gas to the chamber and at 530 applying power to a power feed. At 540, the method includes striking a plasma between the first electrode and the second electrode.

In some embodiments, the apertures in the first electrode and the second electrode have a diameter less than 2 mm, 1 mm or 0.5 mm, and these holes permit gas to pass through the electrodes to the gap.

In one method embodiment, the helical spring comprises an alloy comprising cobalt, chromium, nickel and molybdenum. In one embodiment, the first electrode and the second electrode comprise silicon and the second electrode includes a silicon carbide cladding. In some embodiments, the dielectric spacer comprises a ceramic, such as aluminum oxide. The method may further comprise at 550 forming a film on the substrate.

The processing chamber 10 shown in FIG. 23 is merely representative of one possible configuration and should not be taken as limiting the scope of the disclosure. An option for a plasma source is capacitively coupled plasma. Such plasmas have high plasma density and low plasma potentials. A capacitively coupled plasma is generated via RF currents in conductors. The RF carrying conductors may be separated from the plasma via a dielectric window, thereby minimizing the possibility of metallic contamination of the film.

The frequency of the plasma may be tuned depending on the specific reactive species being used. Suitable frequencies include, but are not limited to, 2 MHz, 13.56 MHz, 40 MHz, 60 MHz and 100 MHz.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. The details of one such staged-vacuum substrate processing apparatus are disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. Any of the deposition processes, e.g., CLD, ALD, CVD can be performed in a substrate processing chamber including a plasma source assembly as described herein. In such cases, these processes may be referred to as plasma enhanced CLD, ALD, or CVD. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present disclosure, other and further embodiments of the disclosure may be devised without departing from the basic scope thereof, and the scope thereof is determined by the claims that follow.

What is claimed is:

1. A plasma source assembly comprising:
   a first electrode comprising a conductive plate having a top surface, a bottom surface, and an outer peripheral edge;
   a second electrode comprising a conductive plate having a top surface, a bottom surface, and an outer peripheral edge;
   a dielectric spacer separating the first electrode and the second electrode and disposed at the outer peripheral edge of the first electrode and the outer peripheral edge of the second electrode;
   a power feed electrically connected to the first electrode and the second electrode; and
   a first helical spring having a shape of a ring disposed between the bottom surface of the first electrode and the dielectric spacer and adjacent to the outer peripheral edge of the first electrode; and
   a second helical spring in the shape of a ring disposed between the top surface of the second electrode and the dielectric spacer and adjacent to the outer peripheral edge of the second electrode, wherein each of the first helical spring and the second helical spring comprises a conductive material.

2. The plasma source assembly of claim 1, wherein each of the first helical spring and the second helical spring comprises a metal.

3. The plasma source assembly of claim 2, wherein the metal is an alloy.

4. The plasma source assembly of claim 3, wherein the alloy comprises cobalt, chromium, nickel and molybdenum.

5. The plasma source assembly of claim 1, further comprising a purge ring surrounding and in contact with the dielectric spacer and a power feed in electrical communication with the purge ring, and wherein the conductive material has an electrical resistivity that permits electrical communication between purge ring, the first electrode and the purge ring and the second electrode.

6. The plasma source assembly of claim 5, wherein the purge ring comprises a metal and the dielectric spacer comprises a ceramic.

7. The plasma source assembly of claim 6, wherein the ceramic comprises aluminum oxide.

8. The plasma source assembly of claim 1, wherein the first electrode and the second electrode are spaced apart to provide a gap between the first electrode and the second electrode, and the first electrode and the second electrode comprise a material that allows a plasma to be formed between the first electrode and the second electrode.

9. The plasma source assembly of claim 8, wherein the first electrode comprises a plurality of apertures that allow a gas to pass through the first electrode and into the gap.

10. The plasma source assembly of claim 1, wherein the first helical spring is in contact with the bottom surface of the first electrode adjacent to the outer peripheral edge of the first electrode, and the second helical spring is in contact with the top surface of the second electrode adjacent to the outer peripheral edge of the second electrode.

11. The plasma source assembly of claim 9, wherein the first electrode and the second electrode comprise silicon and the second electrode includes a silicon carbide cladding.

12. The plasma source assembly of claim 1, wherein
   the first electrode includes a plurality of apertures allowing a gas to flow therethrough; and the second electrode include a plurality of apertures allowing a gas to flow therethrough, the first helical spring comprising a metal alloy and coaxial with the outer peripheral edge of the first electrode, and the second helical spring comprising a metal alloy and coaxial with the outer peripheral edge of the second electrode.

13. A method of processing a substrate in a substrate processing chamber including the plasma source of claim 12, the method comprising:

placing a substrate in the substrate processing and striking a plasma between the first electrode and the second electrode.

14. The method of claim 13, wherein the the first helical spring and the second helical spring each comprises an alloy comprising cobalt, chromium, nickel and molybdenum.

15. The method of claim 14, wherein the first electrode and the second electrode comprise silicon and the second electrode includes a silicon carbide cladding.

16. The method of claim 15, wherein the dielectric spacer comprises a ceramic.

17. The method of claim 16, wherein the ceramic is aluminum oxide.

18. The method of claim 13, further comprising forming a film on the substrate.

* * * * *

UNITED STATES PATENT AND TRADEMARK OFFICE
CERTIFICATE OF CORRECTION

PATENT NO. : 12,394,604 B2  
APPLICATION NO. : 17/017952  
DATED : August 19, 2025  
INVENTOR(S) : Quoc Truong et al.

Page 1 of 1

It is certified that error appears in the above-identified patent and that said Letters Patent is hereby corrected as shown below:

In the Specification

Column 6, Line 30, replace "23" after "shown in FIG." and before "is merely" with "3".

Signed and Sealed this  
Twenty-fifth Day of November, 2025

John A. Squires  
*Director of the United States Patent and Trademark Office*